United States Patent
Lee

(10) Patent No.: US 11,804,258 B2
(45) Date of Patent: Oct. 31, 2023

(54) SEMICONDUCTOR MEMORY APPARATUS, OPERATING METHOD THEREOF, AND SEMICONDUCTOR MEMORY SYSTEM INCLUDING THE SAME

(71) Applicant: SK hynix Inc., Icheon-si Gyeonggi-do (KR)

(72) Inventor: Yo Sep Lee, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 136 days.

(21) Appl. No.: 17/548,159

(22) Filed: Dec. 10, 2021

(65) Prior Publication Data

US 2023/0040958 A1 Feb. 9, 2023

(30) Foreign Application Priority Data

Aug. 9, 2021 (KR) .................. 10-2021-0104817

(51) Int. Cl.
*G11C 11/406* (2006.01)
*G11C 11/408* (2006.01)
*G11C 11/4076* (2006.01)
*G11C 11/4096* (2006.01)

(52) U.S. Cl.
CPC ........ *G11C 11/4085* (2013.01); *G11C 11/406* (2013.01); *G11C 11/4076* (2013.01); *G11C 11/4096* (2013.01)

(58) Field of Classification Search
CPC .............. G11C 11/4085; G11C 11/406; G11C 11/4076; G11C 11/4096
See application file for complete search history.

(56) References Cited

U.S. PATENT DOCUMENTS

| | | | |
|---|---|---|---|
| 8,237,479 B2 | 8/2012 | Kao et al. | |
| 10,770,127 B2 * | 9/2020 | Shore | G11C 11/406 |
| 2013/0304982 A1 * | 11/2013 | Jung | G11C 11/40622 |
| | | | 711/106 |
| 2015/0098288 A1 * | 4/2015 | Bae | G11C 11/40618 |
| | | | 365/230.01 |
| 2019/0066808 A1 | 2/2019 | Nale | |
| 2023/0154521 A1 * | 5/2023 | Kim | G11C 11/40615 |
| | | | 365/222 |

FOREIGN PATENT DOCUMENTS

KR 1020170108431 A 9/2017

* cited by examiner

*Primary Examiner* — Min Huang
(74) *Attorney, Agent, or Firm* — WILLIAM PARK & ASSOCIATES LTD.

(57) ABSTRACT

A semiconductor memory apparatus includes a first memory cell array, a second memory cell array, and a hammering control circuit. The first memory cell array includes a first row hammer memory cell. The second memory cell array includes a second row hammer memory cell. The hammering control circuit controls the number of active operations on a first word line to be stored in the second row hammer memory cell and controls the number of active operations on a second word line to be stored in the first row hammer memory cell.

25 Claims, 6 Drawing Sheets

SEMICONDUCTOR MEMORY APPARATUS, OPERATING METHOD THEREOF, AND SEMICONDUCTOR MEMORY SYSTEM INCLUDING THE SAME

CROSS-REFERENCES TO RELATED APPLICATION

The present application claims priority under 35 U.S.C. § 119(a) to Korean application number 10-2021-0104817, filed on Aug. 9, 2021, in the Korean Intellectual Property Office, which is incorporated herein by reference in its entirety.

BACKGROUND

1. Technical Field

Various embodiments generally relate to a semiconductor memory apparatus, an operating method thereof, and a semiconductor memory system including the same, and more particularly, to a semiconductor memory apparatus capable of substantially preventing or reducing row hammering-related problems, an operating method thereof, and a semiconductor memory system including the same.

2. Related Art

In general, a semiconductor memory apparatus includes a large number of memory cells in order to store data. As circuit design and process technologies are gradually developed, the number of memory cells included in a semiconductor memory apparatus increases exponentially and a circuit area occupied by one memory cell tends to be gradually reduced. In other words, the number of memory cells included in a predetermined area is gradually increasing.

A memory cell is connected to a word line and a bit line. A semiconductor memory apparatus activates the word line and transmits and receives data through the bit line. The semiconductor memory apparatus performs a write operation by storing data received in a memory cell, and performs a read operation by outputting data transmitted from the memory cell. The semiconductor memory apparatus performs an active operation of activating a word line before the write operation and the read operation.

Meanwhile, as the number of memory cells gradually increases, an interval between word lines connected to each of a plurality of memory cells is gradually decreasing. As described above, the word line is a signal line that substantially maintains an activated state during the active operation and then substantially maintains an inactivated state. Therefore, when the active operation is continuously performed on a word line, the corresponding word line toggles as the activated state and the inactivated state are repeated. Accordingly, a coupling phenomenon due to the toggling of the corresponding word line occurs in a word line adjacent to the corresponding word line.

In such a case, the word line adjacent to the word line on which the active operation is performed needs to substantially maintain an inactivated state, but does not substantially maintain a stable inactivated state due to the coupling phenomenon. Therefore, data stored in a memory cell connected to the adjacent word line leaks to a word line having an unstable inactivated state. That is, when the active operation is continuously performed on a specific word line, a memory cell connected to the adjacent word line has a problem in that it loses stored data.

Hereinafter, for convenience of description, a phenomenon of the active operation being concentrated on a specific word line will be defined as row hamming. When the row hamming occurs, a semiconductor memory apparatus performs a refresh operation on an adjacent word line in order to overcome problems due to the row hamming. However, in order to detect the row hamming, the semiconductor memory apparatus requires a circuit for counting the number of active operations on each of a plurality of word lines, a circuit for storing counting values, and the like. Furthermore, these additional circuits act as factors that increase complexity in designing a semiconductor memory apparatus.

SUMMARY

A semiconductor memory apparatus according to an embodiment of the present disclosure may include: a first memory cell array in which at least one of a plurality of first normal memory cells includes a first row hammer memory cell; a second memory cell array in which at least one of a plurality of second normal memory cells includes a second row hammer memory cell; and a hammering control circuit. The hammering control circuit may be configured to control the number of active operations on a first word line connected to the first normal memory cell to be stored in the second row hammer memory cell, and to control the number of active operations on a second word line connected to the second normal memory cell to be stored in the first row hammer memory cell.

An operating method of a semiconductor memory apparatus, which includes a first memory cell array in which at least one of a plurality of first normal memory cells includes a first row hammer memory cell and includes a second memory cell array in which at least one of a plurality of second normal memory cells includes a second row hammer memory cell, may include: performing an active operation on a first word line connected to the first normal memory cell, based on an active command signal and an address signal; performing a read operation on a first counting value corresponding to the number of active operations on the first word line; performing an arithmetic operation on the first counting value by reflecting the number of active operations on the first word line; and writing the first counting value in the second row hammer memory cell.

A semiconductor memory system according to an embodiment of the present disclosure may include a semiconductor memory apparatus and a control device. The semiconductor memory apparatus may include: a first memory cell array in which at least one of a plurality of first normal memory cells includes a first row hammer memory cell; a second memory cell array in which at least one of a plurality of second normal memory cells includes a second row hammer memory cell; a hammering control circuit configured to control a first counting value corresponding to the number of active operations on a first word line connected to the first normal memory cell to be stored in the second row hammer memory cell and to control a second counting value corresponding to the number of active operations on a second word line connected to the second normal memory cell to be stored in the first row hammer memory cell; and an address latching circuit configured to generate a detection signal, which detects row hammering, by comparing each of the first and second counting values with a maximum row hammering value and to latch an address signal corresponding to a corresponding word line. The control device may be configured to provide an external command signal including a hammering refresh command signal based on the detection signal. The hammering control circuit may be configured to perform a refresh operation on a word line, which is adjacent to a word line in which row hammering has occurred, based on the hammering refresh command signal and the address signal latched by the address latching circuit.

DETAILED DESCRIPTION

Figure 1:
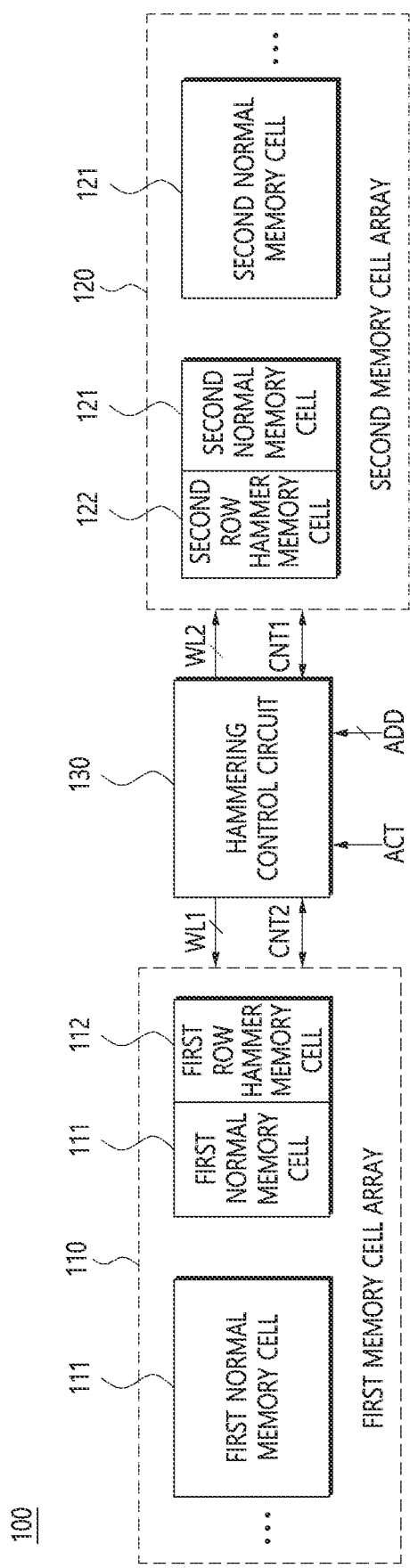
FIG. 1 is a block diagram illustrating a configuration of a semiconductor memory apparatus in accordance with an embodiment of the present disclosure.

The description of the present disclosure is an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the "second," are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of the steps, symbols (e.g., a, b, and c) are used for convenience of description, and the symbols do not describe an order of the steps. The steps may be performed in an order different from the order described in the context unless a specific order is clearly described in the context. That is, the steps may be performed according to a described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as having the same meanings as those in the context in related technology and should not be construed as having ideal or excessively formal meanings, unless dearly defined in the application.

Various embodiments are directed to providing a semiconductor memory apparatus capable of storing the number of active operations on a word line with a minimum circuit configuration, an operating method thereof, and a semiconductor memory system including the same.

Various embodiments are directed to providing a semiconductor memory apparatus capable of performing a refresh operation on an adjacent word line through the number of active operations on a word line, an operating method thereof, and a semiconductor memory system including the same.

An embodiment of the present disclosure has an effect capable of minimizing or reducing an area of a circuit used to store the number of active operations.

An embodiment of the present disclosure has an effect capable of minimizing or reducing an area of a circuit used to solve row hammering-related problems.

FIG. 1 is a block diagram illustrating a configuration of a semiconductor memory apparatus 100 in accordance with an embodiment of the present disclosure.

Referring to FIG. 1, the semiconductor memory apparatus 100 may include a first memory cell array 110, a second memory cell array 120, and a hammering control circuit 130.

The first memory cell array 110 may have a configuration in which at least one of a plurality of first normal memory cells 111 includes a first row hammer memory cell 112. The first normal memory cell 111 may store data during a write operation. As will be described again below, the first row hammer memory cell 112 may store the number of active operations on a second word line WL2 connected to a second normal memory cell 121. The first row hammer memory cell 112 may include a plurality of memory cells having substantially the same memory cell structure as that of the first normal memory cell 111 in order to store the number of active operations on the second word line WL2.

Hereinafter, for convenience of description, a plurality of memory cells, which store the number of active operations, will be defined as "counting memory cells". A plurality of second word lines WL2 may be designed in a row direction. The first row hammer memory cell 112 may include a plurality of counting memory cells in the row direction in correspondence to each of the plurality of second word lines WL2. That is, the first row hammer memory cell 112 may include counting memory cells having a number corresponding to the second word lines WL2.

The second memory cell array 120 may have a configuration in which at least one of a plurality of second normal memory cells 121 includes a second row hammer memory cell 122. The second normal memory cell 121 may store data during a write operation. As will be described again below, the second row hammer memory cell 122 may store the number of active operations on a first word line WL1 connected to the first normal memory cell 111. The second row hammer memory cell 122 may include a plurality of counting memory cells in order to store the number of active operations on the first word line WL1. The second row hammer memory cell 122 may include counting memory cells having a number corresponding to the first word line WL1, similarly to the first row hammer memory cell 112.

The hammering control circuit 130 may be configured to control the number of active operations on the first word line WL1 connected to the first normal memory cell 111 to be stored in the second row hammer memory cell 122. The hammering control circuit 130 may generate a first counting value CNT1 by counting the number of active operations on the first word line WL1. As will be described again below with reference to FIG. 2, the hammering control circuit 130 may control the first counting value CNT1 to be stored in the second row hammer memory cell 122 through a counting write operation.

Furthermore, the hammering control circuit 130 may be configured to control the number of active operations on the second word line WL2 connected to the second normal memory cell 121 to be stored in the first row hammer memory cell 112. The hammering control circuit 130 may generate a second counting value CNT2 by counting the number of active operations on the second line WL2. As will be described again below with reference to FIG. 2, the hammering control circuit 130 may control the second counting value CNT2 to be stored in the first row hammer memory cell 112 through a counting write operation.

Furthermore, the hammering control circuit 130 may perform an active operation on the first and second word lines WL1 and WL2 based on an active command signal ACT and an address signal ADD. The active command signal ACT may be a signal that is activated during the active operation, and the address signal ADD may include row address information inputted from an exterior of the semiconductor memory apparatus 100.

The active operation of the semiconductor memory apparatus 100 in accordance with an embodiment of the present disclosure may be classified into a normal active operation and a counting active operation. In other words, the hammering control circuit 130 may perform the normal active operation and the counting active operation based on the active command signal ACT and the address signal ADD.

The normal active operation may include an active operation for a write operation and a read operation on normal data. Hereinafter, for convenience of description, a write operation and a read operation performed based on the normal active operation will be defined as a 'normal write operation' and a 'normal read operation', respectively. That is, the first and second normal memory cells 111 and 121 described above may perform the normal write operation and the normal read operation on the normal data after the normal active operation.

Furthermore, the counting active operation may include an active operation for a write operation and a read operation on the first and second counting values CNT1 and CNT2, which are the numbers of active operations on the first word line WL1 and the second word line WL2, respectively. Hereinafter, for convenience of description, a write operation and a read operation performed based on the counting active operation will be defined as a 'counting write operation' and a 'counting read operation', respectively. That is, the first and second row hammer memory cells 112 and 122 described above may perform the counting write operation and the counting read operation on the first and second counting values CNT1 and CNT2 after the counting active operation.

Therefore, the hammering control circuit 130 may perform the counting active operation on the second word line WL2 during the normal active operation on the first word line WL1. Furthermore, the hammering control circuit 130 may perform the counting active operation on the first word line WL1 during the normal active operation on the second word line WL2. For reference, the number of active operations may be counted during the normal active operation and might not be counted during the counting active operation.

During a normal active operation on any one of the first and second word lines WL1 and WL2, the semiconductor memory apparatus 100 in accordance with an embodiment of the present disclosure may perform a counting active operation on the other word line. Accordingly, through the counting write operation, the semiconductor memory apparatus 100 may store the number of normal active operations on the first word line WL1 in the second row hammer memory cell 122, and store the number of normal active operations on the second word line WL2 in the first row hammer memory cell 112. Furthermore, as will be described again below, the semiconductor memory apparatus 100 may detect row hammering through a counting operation on the number of normal active operations.

Figure 2:
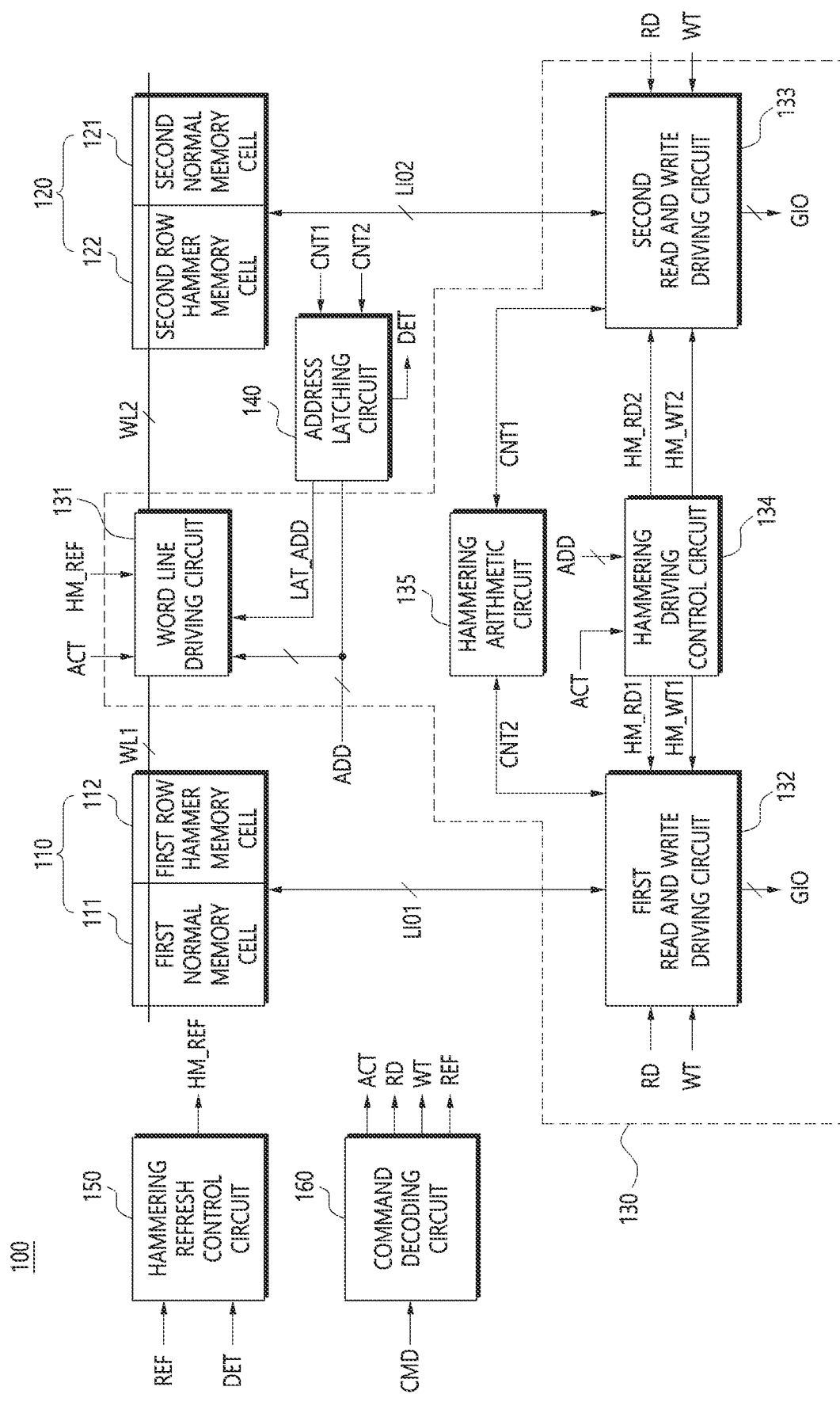
FIG. 2 is a block diagram illustrating a more detailed configuration of the semiconductor memory apparatus in accordance with an embodiment of the present disclosure.

FIG. 2 is a block diagram illustrating a more detailed configuration of the semiconductor memory apparatus 100 in accordance with an embodiment of the present disclosure.

Referring to FIG. 2, the semiconductor memory apparatus 100 may include the first memory cell array 110, the second memory cell array 120, and the hammering control circuit 130.

The first memory cell array 110 may include the first normal memory cells 111 and the first row hammer memory cell 112. The first normal memory cells 111 and the first row hammer memory cell 112 may transmit and receive data through a first local data line LI01. In other words, the first normal memory cells 111 may transmit and receive normal data through the first local data line LI01 during a normal write operation and a normal read operation. The first row hammer memory cell 112 may transmit and receive the second counting value CNT2 described with reference to FIG. 1 through the first local data line LI01 during a counting write operation and a counting read operation.

The second memory cell array 120 may include the second normal memory cells 121 and the second row hammer memory cell 122. The second normal memory cells 121 and the second row hammer memory cell 122 may transmit and receive data through a second local data line LI02. In other words, the second normal memory cells 121 may transmit and receive normal data through the second local data line LI02 during a normal write operation and a normal read operation. The second row hammer memory cell 122 may transmit and receive the first counting value CNT1 described with reference to FIG. 1 through the second local data line LI02 during a counting write operation and a counting read operation.

The hammering control circuit 130 may include a word line driving circuit 131, a first read and write driving circuit 132, a second read and write driving circuit 133, a hammering driving control circuit 134, and a hammering arithmetic circuit 135.

The word line driving circuit 131 may be configured to activate the first and second word lines WL1 and WL2 based on the active command signal ACT and the address signal ADD. As described above, when the first word line WL1 is activated in response to a normal active operation, the second word line WL2 may be activated in response to a counting active operation. Furthermore, when the second word line WL2 is activated in response to a normal active operation, the first word line WL1 may be activated in response to a counting active operation.

The first read and write driving circuit 132 may be connected to the first local data line LI01 and configured to perform a read operation and a write operation on the first memory cell array 110. The first read and write driving circuit 132 may perform a normal read operation and a normal write operation on the first normal memory cell 111 based on a norm& read command signal RD and a normal write command signal WT corresponding to a normal active operation. Normal data transmitted and received through the normal read operation and the normal write operation may be transmitted and received to/from an exterior of the semiconductor memory apparatus 100 through a global data line GI0. Furthermore, the first read and write driving circuit 132 may perform a counting read operation and a counting write operation on the first row hammer memory cell 112 based on a first counting read command signal HM_RD1 and a first counting write command signal HM_WT1 corresponding to a counting active operation. The second counting value CNT2 transmitted and received through the counting read operation and the counting write operation may be transmitted and received to/from the hammering arithmetic circuit 135 to be described below.

That is, the first read and write driving circuit 132 may perform the normal read operation and the normal write operation corresponding to the normal active operation, and perform the counting read operation and the counting write operation corresponding to the counting active operation.

The second read and write driving circuit 133 may be connected to the second local data line LI02 and configured to perform a read operation and a write operation on the second memory cell array 120. The second read and write driving circuit 133 may perform a normal read operation and a normal write operation on the second normal memory cell 121 based on the normal read command signal RD and the normal write command signal WT. Normal data transmitted and received through the normal read operation and the normal write operation may be transmitted and received to/from an exterior through the global data line GI0. Furthermore, the second read and write driving circuit 133 may perform a counting read operation and a counting write operation on the second row hammer memory cell 122 based on a second counting read command signal HM_RD2 and a second counting write command signal HM_WT2 corresponding to a counting active operation. The first counting value CNT1 transmitted and received through the counting read operation and the counting write operation may be transmitted and received to/from the hammering arithmetic circuit 135 to be described below.

That is, the second read and write driving circuit 133 may perform the normal read operation and the normal write operation corresponding to the normal active operation, and perform the counting read operation and the counting write operation corresponding to the counting active operation.

The hammering driving control circuit 134 may be configured to generate counting read command signals HM_RD1 and HM_RD2 and counting write command signals HM_WT1 and HM_WT2 corresponding to the first and second read and write driving circuits 132 and 133, respectively, based on the active command signal ACT and the address signal ADD. The counting read command signals HM_RD1 and HM_RD2 may include the first and second counting read command signals HM_RD1 and HM_RD2 described above, and the counting write command signals HM_WT1 and HM_WT2 may include the first and second counting write command signals HM_WT1 and HM_WT2 described above. The address signal ADD may include address information corresponding to a memory cell array on which a counting active operation is performed.

For example, the first memory cell array 110 and the second memory cell array 120 may be distinguished by one address bit of the row address information. The hammering driving control circuit 134 may selectively activate the first and second counting read command signals HM_RD1 and HM_RD2 through an address signal ADD capable of distinguishing the first memory cell array 110 and the second memory cell array 120. Furthermore, the hammering driving control circuit 134 may selectively activate the first and second counting write command signals HM_WT1 and HM_WT2 through an address signal ADD capable of distinguishing the first memory cell array 110 and the second memory cell array 120.

Figure 3:
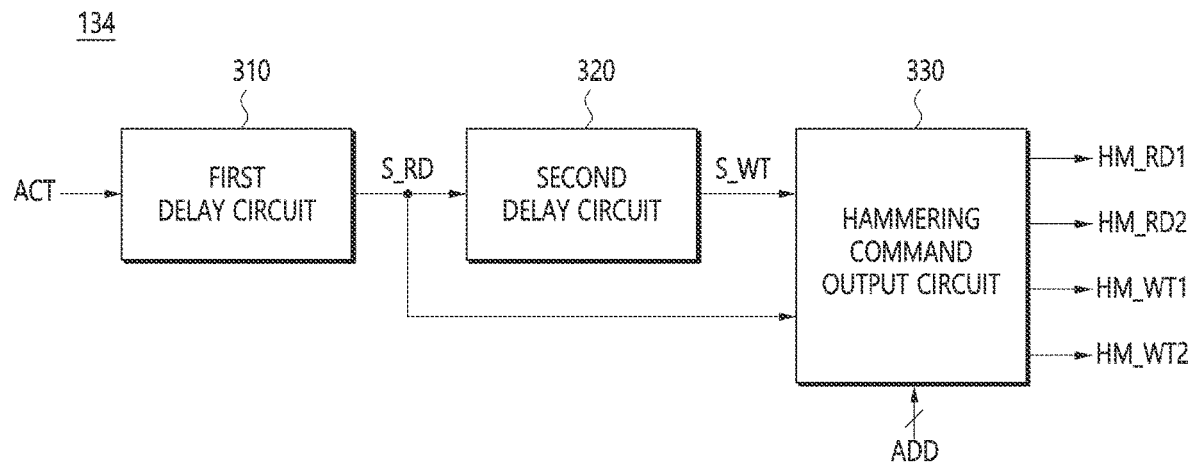
FIG. 3 is a block diagram illustrating a configuration of a hammering driving control circuit in FIG. 2.

Hereinafter, the hammering driving control circuit 134 will be described in more detail. FIG. 3 is a block diagram illustrating a configuration of the hammering driving control circuit 134 in FIG. 2.

Referring to FIG. 3, the hammering driving control circuit 134 may include a first delay circuit 310, a second delay circuit 320, and a hammering command output circuit 330.

The first delay circuit 310 may be configured to delay the active command signal ACT by a time corresponding to a counting read operation, and output a delayed signal. The time corresponding to the counting read operation may include a time until a counting active operation is performed based on the active command signal ACT and then a counting read operation can be performed. In other words, the first delay circuit 310 may generate a source read command signal S_RD that is activated when the counting read operation is possible after the active command signal ACT is activated.

The second delay circuit 320 may be configured to delay the active command signal ACT by a time corresponding to a counting write operation, and output a delayed signal. The time corresponding to the counting write operation may include a time until a counting active operation is performed based on the active command signal ACT, a counting read operation is performed, a counting operation on the first and second counting values CNT1 and CNT2 is performed, and then a counting write operation can be performed. In other words, the second delay circuit 320 may generate a source write command signal S_WT that is activated when the counting write operation is possible after the active command signal ACT and the source read command signal S_RD are sequentially activated.

The hammering command output circuit 330 may be configured to generate the first and second counting read command signals HM_RD1 and HM_RD2 and the first and second counting write command signals HM_WT1 and HM_WT2 based on the address signal ADD and the output signals S_RD and S_WT of the first and second delay circuits 310 and 320. The first and second counting read command signals HM_RD1 and HM_RD2 may be signals that are activated based on the source read command signal S_RD. Furthermore, the first and second counting write command signals HM_WT1 and HM_WT2 may be signals that are activated based on the source write command signal S_WT. As described above, the hammering command output circuit 330 may selectively activate the first and second counting read command signals HM_RD1 and HM_RD2 and the first and second counting write command signals HM_WT1 and HM_WT2 based on the address signal ADD.

Referring again to FIG. 2, the hammering arithmetic circuit 135 may be configured to receive the first and second counting values CNT1 and CNT2 outputted from the first and second read and write driving circuits 132 and 133 during the normal active operation, to perform an addition operation on the first and second counting values CNT1 and CNT2, and to output an addition result. The hammering arithmetic circuit 135 may be implemented as an addition circuit.

More specifically, the hammering arithmetic circuit 135 may receive the first counting value CNT1 from the second read and write driving circuit 133 during the normal active operation on the first word line WL1. Then, the hammering arithmetic circuit 135 may perform a +1 incrementation on the received first counting value CNT1 and output an arithmetic result to the second read and write driving circuit 133 again. The second read and write driving circuit 133 may store the first counting value CNT1 in the second row hammer memory cell 122 again based on the second counting write command signal HM_WT2.

Furthermore, the hammering arithmetic circuit 135 may receive the second counting value CNT2 from the first read and write driving circuit 132 during the normal active operation on the second word line WL2. Then, the hammering arithmetic circuit 135 may perform a +1 incrementation on the received second counting value CNT2 and output an arithmetic result to the first read and write driving circuit 132 again. The first read and write driving circuit 132 may store the second counting value CNT2 in the first row hammer memory cell 112 again based on the first counting write command signal HM_WT1.

Through the configuration described with reference to FIG. 1, the semiconductor memory apparatus 100 in accordance with an embodiment of the present disclosure may update and store the number of active operations on a word line.

In addition, the semiconductor memory apparatus 100 in accordance with an embodiment of the present disclosure may include an address latching circuit 140.

The address latching circuit 140 may be configured to detect row hammering based on each of the first and second counting values CNT1 and CNT2 and a maximum row hammering value. Furthermore, the address latching circuit 140 may be configured to detect the row hammering and latch an address signal ADD corresponding to a corresponding word line.

Figure 4:
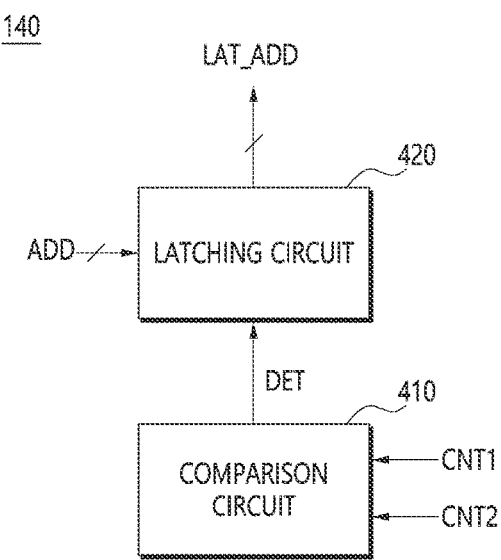
FIG. 4 is a block diagram illustrating a configuration of an address latching circuit in FIG. 2.

Hereinafter, the address latching circuit 140 will be described in more detail. FIG. 4 is a block diagram illustrating a configuration of the address latching circuit 140 in FIG. 2.

Referring to FIG. 4, the address latching circuit 140 may include a comparison circuit 410 and a latching circuit 420.

The comparison circuit 410 may be configured to generate a detection signal DET by comparing each of the first and second counting values CNT1 and CNT2 with the maximum row hammering value. The maximum row hammering value may include a maximum value for the number of active operations in which row hammering-related problems occur. The comparison circuit 410 may generate the detection signal DET when the first counting value CNT1 corresponds to the maximum row hammering value. Furthermore, the comparison circuit 410 may generate the detection signal DET when the second counting value CNT2 corresponds to the maximum row hammering value.

The latching circuit 420 may be configured to latch the address signal ADD based on the detection signal DET. As described above, the detection signal DET is a signal that is activated when each of the first and second counting values CNT1 and CNT2 corresponds to the maximum row hammering value. Accordingly, when each of the numbers of normal active operations on the first and second word lines WL1 and WL2 reaches the maximum row hammering value, the latching circuit 420 may latch an address signal ADD corresponding to a corresponding word line. An address signal LAT_ADD latched by the latching circuit 420 may be provided to the word line driving circuit 131.

Through the configuration described with reference to FIG. 4, when row hammering occurs in the first and second word lines WL1 and WL2, the address latching circuit 140 may latch an address signal ADD corresponding to a corresponding word line.

Referring again to FIG. 2, the word line driving circuit 131 may perform a refresh operation on a word line, which is adjacent to a word line in which row hammering has occurred, based on a hammering refresh command signal HM_REF.

Figure 5:
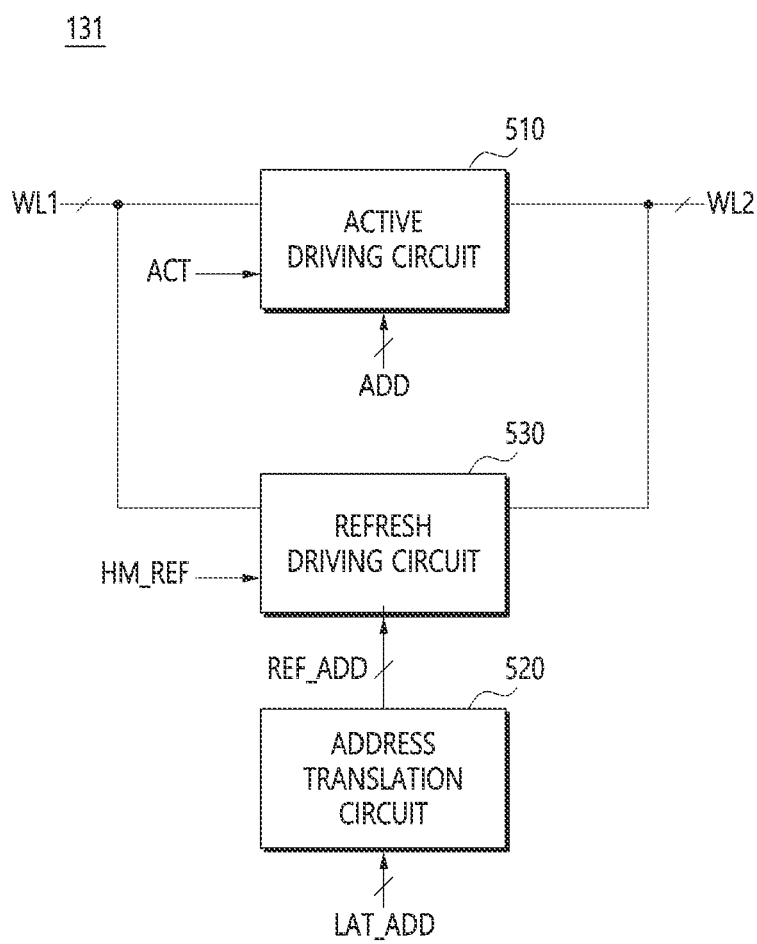
FIG. 5 is a block diagram illustrating a configuration of a word line driving circuit in FIG. 2.

Hereinafter, the word line driving circuit 131 will be described in more detail. FIG. 5 is a block diagram illustrating a configuration of the word line driving circuit 131 in FIG. 2.

Referring to FIG. 5, the word line driving circuit 131 may include an active driving circuit 510, an address translation circuit 520, and a refresh driving circuit 530.

The active driving circuit 510 may be configured to activate the first and second word lines WL1 and WL2 based on the active command signal ACT and the address signal ADD. As described above, the active driving circuit 510 may perform a normal active operation on any one of the first and second word lines WL1 and WL2 based on the active command signal ACT, and perform a counting active operation on the other word line.

The address translation circuit 520 may be configured to generate a refresh address signal REF_ADD by translating the address signal LAT_ADD latched by the address latching circuit 140 in FIG. 2. As described above, the latched address signal LAT_ADD may be an address signal ADD corresponding to the word line in which the row hammering has occurred. The word line adjacent to the word line in which the row hammering has occurred may correspond to +1 or −1 in the latched address signal LAT_ADD. Accordingly, the address translation circuit 520 may generate the refresh address signal REF_ADD by performing +1 or −1 on the latched address signal LAT_ADD.

The refresh driving circuit 530 may be configured to perform a refresh operation on a word line corresponding to the refresh address signal REF_ADD based on the hammering refresh command signal HM_REF.

Through the configuration described with reference to FIG. 5, the word line driving circuit 131 may perform a refresh operation on the word line adjacent to the word line in which the row hammering has occurred.

Referring again to FIG. 2, the semiconductor memory apparatus 100 in accordance with an embodiment of the present disclosure may count and store the number of active operations on a word line. Furthermore, the semiconductor memory apparatus 100 may detect the row hammering through the stored first and second counting values CNT1 and CNT2, and perform a refresh operation on the adjacent word line. The refresh operation may include a refresh active operation on the adjacent word line and a refresh read operation and a refresh write operation on a memory cell connected to the adjacent word line.

In addition, the semiconductor memory apparatus 100 in accordance with an embodiment of the present disclosure may include a hammering refresh control circuit 150 and a command decoding circuit 160.

The hammering refresh control circuit 150 may be configured to generate the hammering refresh command signal HM_REF when row hammering is detected in the first and second word lines WL1 and WL2. The hammering refresh control circuit 150 may generate the hammering refresh command signal HM_REF based on a refresh command signal REF and the detection signal DET.

Through the configuration described with reference to FIG. 2, the semiconductor memory apparatus 100 in accordance with an embodiment of the present disclosure may generate the hammering refresh command signal HM_REF based on the detection signal DET that is activated when row hammering is detected.

The command decoding circuit 160 may be configured to generate a plurality of internal command signals ACT, RD, WT, and REF based on an external command signal CMD. The command decoding circuit 160 may generate the active command signal ACT, the normal read command signal RD, the normal write command signal WT, the refresh command signal REF, and the like. The refresh command signal REF may be a command signal for controlling an auto-refresh operation and a self-refresh operation.

Figure 6:
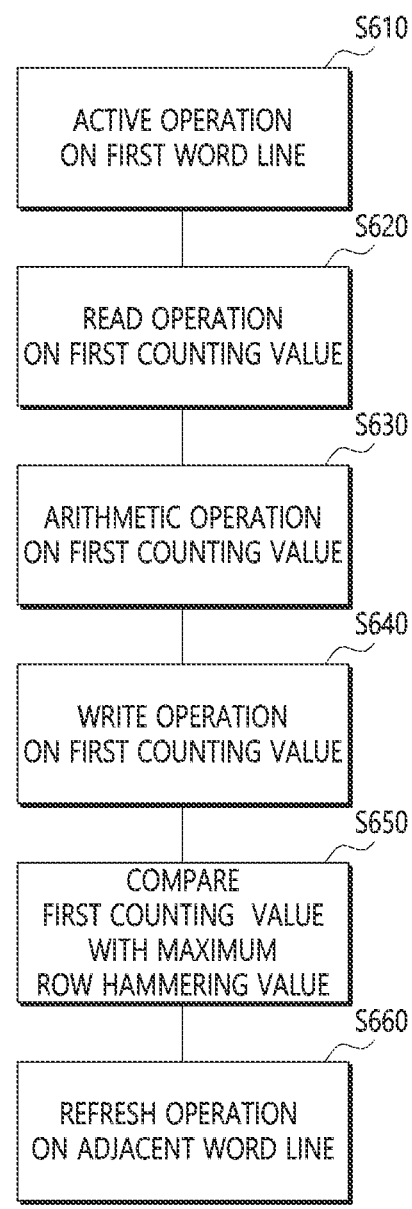
FIG. 6 is a flowchart illustrating an operating method of the semiconductor memory apparatus in FIG. 1 to FIG. 5.

FIG. 6 is a flowchart illustrating an operating method of the semiconductor memory apparatus 100 in FIG. 1 to FIG. 5. For convenience of description, a case in which row hammering occurs in the first word line WL1 will be described as an example.

Referring to FIG. 1 to FIG. 6, the operating method of the semiconductor memory apparatus 100 may include a step S610 of performing an active operation on the first word line WL1, a step S620 of performing a read operation on the first counting value CNT1, a step S630 of performing an arithmetic operation on the first counting value CNT1, and a step S640 of performing a write operation on the first counting value CNT1.

The step S610 of performing an active operation on the first word line WL1 may be a step of performing an active operation on the first word line WL1 connected to the first normal memory cell 111, based on the active command signal ACT and the address signal ADD. The step S610 of performing an active operation may include a normal active operation.

The step S610 of performing an active operation may be performed by the word line driving circuit 131 in FIG. 2. The word line driving circuit 131 may perform a normal active operation on the first word line WL1 based on the active command signal ACT and the address signal ADD. Then, the first read and write driving circuit 132 may perform a normal read operation of outputting normal data stored in the first normal memory cell 111, based on the normal read command signal RD. Furthermore, the first read and write driving circuit 132 may perform a normal write operation of storing normal data in the first normal memory cell 111 based on the normal write command signal WT.

The step S620 of performing a read operation on the first counting value CNT1 may be a step of performing a read operation on the first counting value CNT1 corresponding to the number of active operations on the first word line WL1. The step S620 of performing a read operation may include a counting active operation and a counting read operation.

The step S620 of performing a read operation may be performed by the word line driving circuit 131, the second row hammer memory cell 122, and the second read and write driving circuit 133 in FIG. 2. The word line driving circuit 131 may perform a counting active operation on the second word line WL2 connected to the second row hammer memory cell 122, based on the active command signal ACT and the address signal ADD. Then, the second read and write driving circuit 133 may perform a counting read operation on the first counting value CNT1 stored in the second row hammer memory cell 122, based on the second counting read command signal HM_RD2. That is, through the step S620 of performing a read operation, the first counting value CNT1 may be outputted from the second row hammer memory cell 122 to the second read and write driving circuit 133 via the second local data line LI02.

The step S630 of performing an arithmetic operation on the first counting value CNT1 may be a step of performing an arithmetic operation on the first counting value CNT1 by reflecting the number of active operations on the first word line WL1. In the step S630 of performing an arithmetic operation, an addition operation may be performed on the first counting value CNT1 during the active operation on the first word line WL1. In the step S630 of performing an arithmetic operation, when a normal active operation is performed on the first word line, a +1 incrementation may be performed on the first counting value CNT1. The step S630 of performing an arithmetic operation may be performed by the hammering arithmetic circuit 135 in FIG. 2. The hammering arithmetic circuit 135 may receive the first counting value CNT1, perform the +1 incrementation on the first counting value CNT1, and output an arithmetic result as the first counting value CNT1 again.

The step S640 of performing a write operation on the first counting value CNT1 may be a step of writing the first counting value CNT1 in the second row hammer memory cell 122.

The step S640 of performing a write operation may be performed by the second read and write driving circuit 133 and the second row hammer memory cell 122 in FIG. 2. The second read and write driving circuit 133 may perform a counting write operation on the first counting value CNT1, for which the arithmetic operation has been completed, in the second row hammer memory cell 122 based on the first counting write command signal HM_WT1. That is, through the step S640 of performing a write operation, the first counting value CNT1 may be stored in the second row hammer memory cell 122 from the second read and write driving circuit 133 via the second local data line LI02.

The semiconductor memory apparatus in accordance with an embodiment of the present disclosure may store information on row hammering having occurred in the first word line WL1 in the second row hammer memory cell 122, and store information on row hammering having occurred in the second word line WL2 in the first row hammer memory cell 112.

Furthermore, the operating method of the semiconductor memory apparatus may include a step S650 of comparing the first counting value CNT1 with the maximum row hammering value and a step S660 of performing a refresh operation on an adjacent word line.

The step S650 of comparing the first counting value CNT1 with the maximum row hammering value may be performed by the address latching circuit 140 in FIG. 2. The address latching circuit 140 may generate the detection signal DET by comparing the first counting value CNT1 with the maximum row hammering value. Then, the address latching circuit 140 may generate the latched address signal LAT_ADD corresponding to the first word line WL1 in which row hammering has occurred.

The step S660 of performing a refresh operation on an adjacent word line may be a step of performing a refresh operation on a word line, which is adjacent to a word line in which row hammering has occurred, based on the detection signal DET generated in the step S650 of comparing.

The step S660 of performing a refresh operation may be performed by the word line driving circuit 131 in FIG. 2. The word line driving circuit 131 may perform a refresh operation on a word line, which is adjacent to the first word line WL1 in which row hammering has occurred, based on the hammering refresh command signal HM_REF and the latched address signal LAT_ADD.

In addition, the semiconductor memory apparatus 100 in accordance with an embodiment of the present disclosure may store the first counting value CNT1 in the second row hammer memory cell 122, and store the second counting value CNT2 in the first row hammer memory cell 112. At this time, the first and second counting values CNT1 and CNT2 may be reset after an initialization operation section and the refresh operation of the semiconductor memory apparatus 100.

Figure 7:
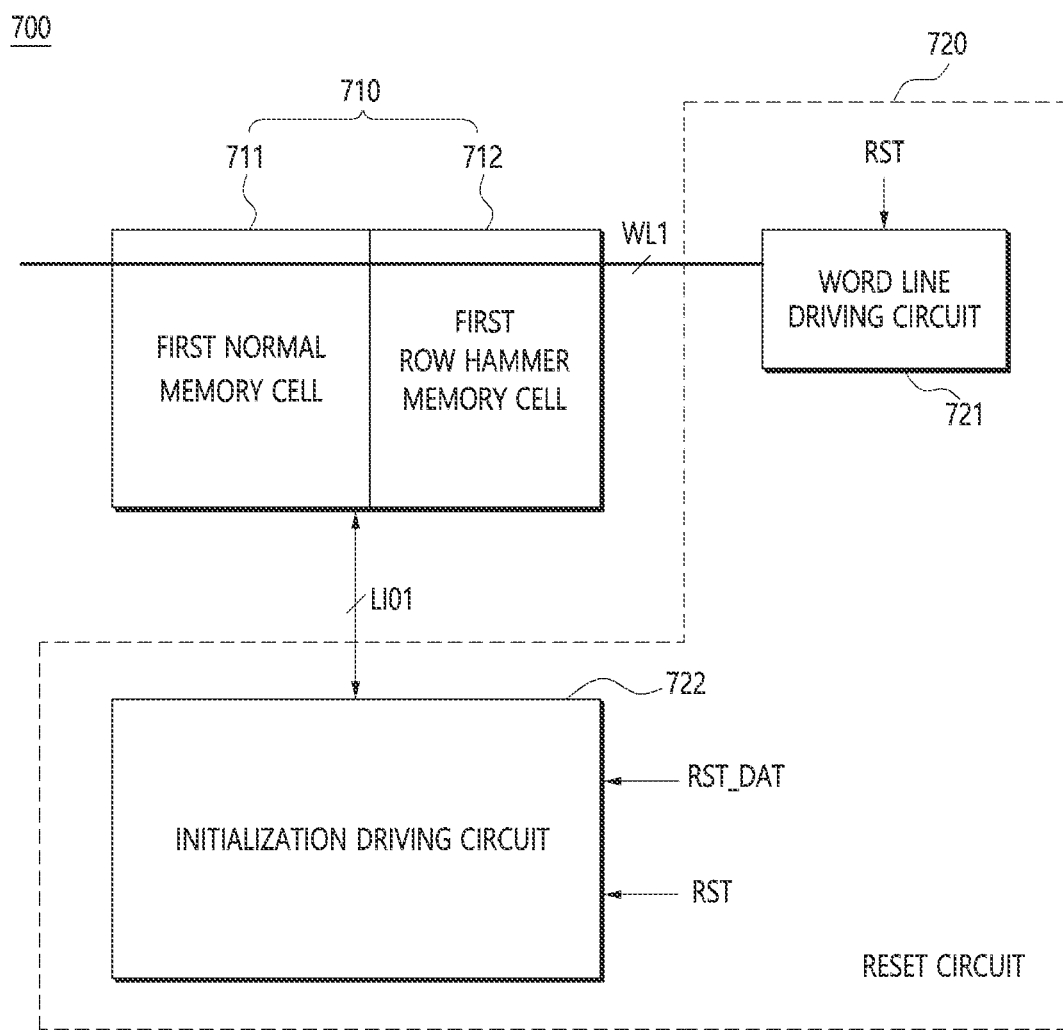
FIG. 7 is a block diagram illustrating a configuration of a semiconductor memory apparatus in accordance with an embodiment of the present disclosure.

In this regard, FIG. 7 is a block diagram illustrating a configuration of a semiconductor memory apparatus 700 in accordance with an embodiment of the present disclosure. For convenience of description, a reset operation on a first memory cell array 710 will be representatively described.

The semiconductor memory apparatus 700 may include the first memory cell array 710 and a reset circuit 720. The first memory cell array 710 may be a component corresponding to the first memory cell array 110 in FIG. 1. That is, the first memory cell array 710 may include a first normal memory cell 711 and a first row hammer memory cell 712.

The reset circuit 720 may be configured to reset data stored in the first row hammer memory cell 712 during a reset operation. The reset circuit 720 will be described in more detail. The reset circuit 720 may include a word line driving circuit 721 and an initialization driving circuit 722.

The word line driving circuit 721 may be configured to perform an active operation on the first word line WL1 connected to the first row hammer memory cell 712, based on a reset signal RST corresponding to the reset operation. The reset signal RST may be a signal that is activated after the initialization operation section and the refresh operation. Although not illustrated in the drawing, the word line driving circuit 721 may perform an active operation on the second word line WL2 based on the reset signal RST.

The initialization driving circuit 722 may be configured to perform a write operation on an initialization data value RST_DAT in the first row hammer memory cell 712 based on the reset signal RST. The initialization data value RST_DAT may include '0'. In other words, the initialization driving circuit 722 may store '0', which is the initialization data value RST_DAT, in the first row hammer memory cell 712 based on the reset signal RST. That is, the first row hammer memory cell 712 may be reset after the initialization operation section and the refresh operation of the semiconductor memory apparatus 100. The initialization driving circuit 722 may correspond to, for example, the first read and write driving circuit 132 in FIG. 2. Although not illustrated in the drawing, the initialization driving circuit 722 may perform a write operation on the initialization data value RST_DAT in the second row hammer memory cell based on the reset signal RST. At this time, the initialization driving circuit 722 may correspond to, for example, the second read and write driving circuit 133 in FIG. 2.

Figure 8:
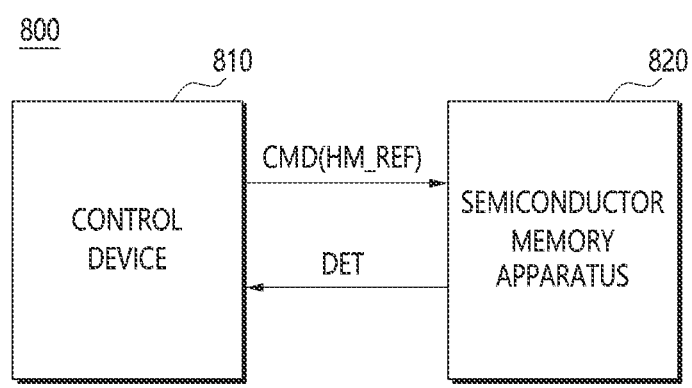
FIG. 8 is a block diagram illustrating a configuration of a semiconductor memory system in accordance with an embodiment of the present disclosure.

FIG. 8 is a block diagram illustrating a configuration of a semiconductor memory system 800 in accordance with an embodiment of the present disclosure.

Referring to FIG. 8, the semiconductor memory system 800 may include a control device 810 and a semiconductor memory apparatus 820. The semiconductor memory apparatus 820 may have the configuration described with reference to FIG. 1 to FIG. 7. Particularly, as described with reference to FIG. 2, the semiconductor memory apparatus 820 may generate the detection signal DET.

The control device 810 may be configured to provide an external command signal CMD including a hammering refresh command signal HM_REF based on the detection signal DET. For reference, in FIG. 2, the hammering refresh control circuit 150 provides the hammering refresh command signal HM_REF. The control device 810 in FIG. 8 may receive the detection signal DET from the semiconductor memory apparatus 820. Accordingly, the control device 810 may generate the hammering refresh command signal HM_REF.

In addition, the control device 810 may provide the external command signal CMD in order to control the semiconductor memory apparatus 820. The external command signal CMD may be inputted to the command decoding circuit 160 in FIG. 2, and the command decoding circuit 160 may generate the hammering refresh command signal HM_REF. The semiconductor memory apparatus 820 may control the hammering refresh control circuit 150 in FIG. 2.

The semiconductor memory system 800 in accordance with an embodiment of the present disclosure may provide the control device 810 with the detection signal DET that detects row hammering. Accordingly, the control device 810 may control a refresh operation of the semiconductor memory apparatus 820 on the row hammering.

Although various embodiments have been described for illustrative purposes, it will be apparent to those skilled in the art that various changes and modifications may be made without departing from the spirit and scope of the disclosure as defined in the following claims.

What is claimed is:

1. A semiconductor memory apparatus comprising:
    a first memory cell array in which at least one of a plurality of first normal memory cells includes a first row hammer memory cell;
    a second memory cell array in which at least one of a plurality of second normal memory cells includes a second row hammer memory cell; and
    a hammering control circuit configured to:
        control the number of active operations on a first word line connected to the first normal memory cell to be stored in the second row hammer memory cell; and
        control the number of active operations on a second word line connected to the second normal memory cell to be stored in the first row hammer memory cell.

2. The semiconductor memory apparatus according to claim 1, wherein:
    the first row hammer memory cell includes counting memory cells having a number corresponding to the second word line; and
    the second row hammer memory cell includes counting memory cells having a number corresponding to the first word line.

3. The semiconductor memory apparatus according to claim 1, wherein the hammering control circuit is configured to perform a normal active operation on any one of the first and second word lines and a counting active operation on the other word line, based on an active command signal and an address signal.

4. The semiconductor memory apparatus according to claim 3, wherein the hammering control circuit is configured to count the number of active operations during the normal active operation.

5. The semiconductor memory apparatus according to claim 1, wherein:
the first normal memory cell and the first row hammer memory cell transmit and receive data through a first local data line; and
the second normal memory cell and the second row hammer memory cell transmit and receive data through a second local data line.

6. The semiconductor memory apparatus according to claim 5, wherein the hammering control circuit comprises:
a word line driving circuit configured to activate the first and second word lines based on an active command signal and an address signal;
a first read and write driving circuit connected to the first local data line and configured to perform a read operation and a write operation on the first memory cell array;
a second read and write driving circuit connected to the second local data line and configured to perform a read operation and a write operation on the second memory cell array;
a hammering driving control circuit configured to generate a counting read command signal and a counting write command signal corresponding to each of the first and second read and write driving circuits based on the active command signal and the address signal; and
a hammering arithmetic circuit configured to:
receive first and second counting values outputted from the first and second read and write driving circuits during a normal active operation;
perform an addition operation on the first and second counting values; and
output an addition result.

7. The semiconductor memory apparatus according to claim 6, wherein the first and second read and write driving circuits each perform:
a counting read operation based on the counting read command signal; and
a counting write operation based on the counting write command signal.

8. The semiconductor memory apparatus according to claim 6, wherein:
the first counting value corresponds to the number of active operations on the first word line; and
the second counting value corresponds to the number of active operations on the second word line.

9. The semiconductor memory apparatus according to claim 6, wherein the hammering driving control circuit comprises:
a first delay circuit configured to delay the active command signal by a time corresponding to a counting read operation, and output a delayed signal;
a second delay circuit configured to delay the active command signal by a time corresponding to a counting write operation, and output a delayed signal; and
a hammering command output circuit configured to output the counting read command signal and the counting write command signal based on the address signal and output signals of the first and second delay circuits.

10. The semiconductor memory apparatus according to claim 1, further comprising an address latching circuit configured to:
detect row hammering based on each of the first and second counting values and a maximum row hammering value; and
latch an address signal corresponding to a corresponding word line.

11. The semiconductor memory apparatus according to claim 10, wherein the address latching circuit comprises:
a comparison circuit configured to generate a detection signal by comparing each of the first and second counting values with the maximum row hammering value; and
a latching circuit configured to latch the address signal based on the detection signal.

12. The semiconductor memory apparatus according to claim 10, wherein the word line driving circuit is configured to perform a refresh operation on a word line, which is adjacent to a word line in which row hammering has occurred, based on a hammering refresh command signal.

13. The semiconductor memory apparatus according to claim 12, wherein the word line driving circuit comprises:
an active driving circuit configured to activate the first and second word lines based on the active command signal and the address signal;
an address translation circuit configured to generate a refresh address signal by translating the address signal latched by the address latching circuit; and
a refresh driving circuit configured to perform a refresh operation on a word line corresponding to the refresh address signal, based on the hammering refresh command signal.

14. The semiconductor memory apparatus according to claim 12, further comprising:
a hammering refresh control circuit configured to generate the hammering refresh command signal when row hammering is detected in the first and second word lines.

15. The semiconductor memory apparatus according to claim 1, further comprising:
a reset circuit configured to reset data, stored in the first and second row hammer memory cells, during a reset operation.

16. The semiconductor memory apparatus according to claim 15, wherein the reset circuit comprises:
a word line driving circuit configured to perform an active operation on the first and second word lines connected to the first and second row hammer memory cells, respectively, based on a reset signal corresponding to the reset operation; and
an initialization driving circuit configured to perform a write operation on an initialization data value in the first and second row hammer memory cells based on the reset signal.

17. An operating method of a semiconductor memory apparatus including a first memory cell array in which at least one of a plurality of first normal memory cells includes a first row hammer memory cell and including a second memory cell array in which at least one of a plurality of second normal memory cells includes a second row hammer memory cell, the operating method comprising:
performing an active operation on a first word line connected to the first normal memory cell, based on an active command signal and an address signal;

performing a read operation on a first counting value corresponding to the number of active operations on the first word line;

performing an arithmetic operation on the first counting value by reflecting the number of active operations on the first word line; and writing the first counting value in the second row hammer memory cell.

18. The operating method according to claim 17, wherein performing the active operation comprises performing a normal active operation on the first word line.

19. The operating method according to claim 17, wherein performing the read operation comprises performing:
a counting active operation on a second word line connected to the second row hammer memory cell; and
a counting read operation on the first counting value stored in the second row hammer memory cell.

20. The operating method according to claim 17, wherein performing the arithmetic operation comprises performing an addition operation on the first counting value during the active operation on the first word line.

21. The operating method according to claim 17, wherein performing the write operation comprises performing a counting write operation to write the first counting value in the second row hammer memory cell.

22. The operating method according to claim 17, further comprising:
comparing the first counting value with a maximum row hammering value; and
performing a refresh operation on a word line, which is adjacent to a word line in which row hammering has occurred, based on a detection signal generated in the step of comparing.

23. The operating method according to claim 22, further comprising:
performing a reset operation on the first and second row hammer memory cells after an initialization operation section of the operation; and
outputting a delayed signal and performing a refresh operation.

24. The operating method according to claim 23, wherein performing the reset operation comprises performing:
an active operation on the first and second word lines; and
a write operation to write an initialization data value in the first and second row hammer memory cells.

25. A semiconductor memory system comprising:
a semiconductor memory apparatus including:
a first memory cell array in which at least one of a plurality of first normal memory cells includes a first row hammer memory cell;
a second memory cell array in which at least one of a plurality of second normal memory cells includes a second row hammer memory cell;
a hammering control circuit configured to control a first counting value corresponding to the number of active operations on a first word line connected to the first normal memory cell to be stored in the second row hammer memory cell and to control a second counting value corresponding to the number of active operations on a second word line connected to the second normal memory cell to be stored in the first row hammer memory cell; and
an address latching circuit configured to generate a detection signal, which detects row hammering, based on each of the first and second counting values and a maximum row hammering value and to latch an address signal corresponding to a corresponding word line; and
a control device configured to provide an external command signal including a hammering refresh command signal based on the detection signal,
wherein the hammering control circuit is configured to perform a refresh operation on a word line, which is adjacent to a word line in which row hammering has occurred, based on the hammering refresh command signal and the address signal latched by the address latching circuit.

* * * * *